(12) United States Patent
Sigel et al.

(10) Patent No.: US 9,030,644 B2
(45) Date of Patent: May 12, 2015

(54) PROJECTION EXPOSURE APPARATUS FOR SEMICONDUCTOR LITHOGRAPHY INCLUDING AN ACTUATOR SYSTEM

(75) Inventors: Benjamin Sigel, Aalen (DE); Andreas Bertele, Steinheim (DE); Peter Kloesch, Oberkochen (DE); Martin Mahlmann, Lauchheim (DE); Jochen Weber, Heidenheim-Grosskuchen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 707 days.

(21) Appl. No.: 13/196,239

(22) Filed: Aug. 2, 2011

(65) Prior Publication Data

US 2011/0317140 A1 Dec. 29, 2011

Related U.S. Application Data

(63) Continuation of application No. PCT/EP2010/051926, filed on Feb. 16, 2010.

(60) Provisional application No. 61/153,013, filed on Feb. 17, 2009.

(30) Foreign Application Priority Data

Feb. 17, 2009 (DE) .......................... 10 2009 009 221

(51) Int. Cl.
  *G03B 27/42* (2006.01)
  *G03B 27/52* (2006.01)
  *G03F 7/20* (2006.01)

(52) U.S. Cl.
  CPC ............ *G03F 7/709* (2013.01); *G03F 7/70266* (2013.01); *G03F 7/70825* (2013.01); *G03F 7/70891* (2013.01)

(58) Field of Classification Search
  CPC ............ G03F 7/70891; G03F 7/70266; G03F 7/70825; G03F 7/70833
  USPC ......... 355/30, 53, 67; 359/290–291, 819–820
  See application file for complete search history.

(56) References Cited

U.S. PATENT DOCUMENTS 5,231,291 A * 7/1993 Amemiya et al. ......... 250/443.1
6,667,796 B1 * 12/2003 Nishi .............................. 355/30

(Continued)

FOREIGN PATENT DOCUMENTS

DE           102 25 266 A1      7/2003
DE        10 2005 015 627        10/2006

(Continued)

OTHER PUBLICATIONS

The International Search Report and a Written Opinion from the counterpart PCT Application No. PCT/EP2010/051926, dated Jun. 1, 2010.

(Continued)

*Primary Examiner* — Hung Henry Nguyen
(74) *Attorney, Agent, or Firm* — Fish & Richardson P.C.

(57) ABSTRACT

The disclosure relates to a projection exposure apparatus for semiconductor lithography which includes an actuator system to mechanically actuate a component of the projection exposure apparatus. The actuator system has at least one mechanism to reduce and/or dampen the heat input into the component that is due to heat arising during the operation of the actuator system.

25 Claims, 5 Drawing Sheets

(56) References Cited

U.S. PATENT DOCUMENTS

| | | | |
|---|---|---|---|
| 6,788,386 B2 * | 9/2004 | Cox et al. | 355/53 |
| 6,992,306 B2 * | 1/2006 | Honda et al. | 250/492.2 |
| 7,151,588 B2 * | 12/2006 | Franken et al. | 355/30 |
| 7,710,542 B2 | 5/2010 | Hummel et al. | |
| 8,044,373 B2 | 10/2011 | Butler | |
| 2003/0197914 A1 | 10/2003 | Cox et al. | |
| 2004/0079898 A1 | 4/2004 | Buis et al. | |
| 2005/0094118 A1 | 5/2005 | Dams | |
| 2005/0190351 A1 | 9/2005 | Cox et al. | |
| 2005/0236915 A1 | 10/2005 | Phillips | |
| 2006/0230413 A1 | 10/2006 | Rassel et al. | |
| 2006/0232866 A1 | 10/2006 | Sai et al. | |
| 2007/0096566 A1 | 5/2007 | Hol et al. | |
| 2007/0114655 A1 | 5/2007 | Hol et al. | |
| 2007/0248127 A1 | 10/2007 | Shiraishi | |
| 2007/0286035 A1 | 12/2007 | Uchida | |
| 2008/0117397 A1 | 5/2008 | Weber et al. | |

FOREIGN PATENT DOCUMENTS

| | | |
|---|---|---|
| EP | 1 321 822 | 6/2003 |
| EP | 1 376 238 | 1/2004 |
| JP | 2003-107311 | 4/2003 |
| JP | 2003-203860 | 7/2003 |
| JP | 2005-026329 | 1/2005 |
| JP | 2006-140366 | 6/2006 |
| JP | 2006-295023 A | 10/2006 |
| JP | 2007-019225 | 1/2007 |
| JP | 2007-316132 | 12/2007 |
| JP | 2008-205428 A | 9/2008 |
| JP | 2008-311647 | 12/2008 |

OTHER PUBLICATIONS

Japanese Office Action, with English translation, for corresponding JP Appl No. 2011-549602, dated Dec. 18, 2012.

Japanese Office Action, with translation thereof, for JP Appl No. 2013-267424, dated Oct. 21, 2014.

* cited by examiner

PROJECTION EXPOSURE APPARATUS FOR SEMICONDUCTOR LITHOGRAPHY INCLUDING AN ACTUATOR SYSTEM

CROSS-REFERENCE TO RELATED APPLICATIONS

This application is a continuation of, and claims benefit under 35 USC 120 to, international application PCT/EP2010/051926, filed Feb. 16, 2010, which claims benefit under 35 USC 119 of German Application No. 10 2009 009 221.8, filed Feb. 17, 2009 and under 35 USC 119(e) of U.S. Ser. No. 61/153,013, filed Feb. 17, 2009. International application PCT/EP2010/051926 is hereby incorporated by reference in its entirety.

A number of references are incorporated herein by reference. In the event of an inconsistency between the explicit disclosure of the present application and the disclosures in the references, the present application will control.

FIELD

The disclosure relates to a projection exposure apparatus equipped with an actuator system for semiconductor lithography.

BACKGROUND

Projection exposure apparatus for semiconductor lithography are e.g. described in US 2007/0248127 A1, US 2007/0096566 A1, US 2007/0114655 A1, US 2004/0079898 A1, US 2005/0094118 A1 and US 2005/190351 A1. In general the actuator system can be embodied as a damping system for reducing mechanical vibrations. In this case, the mechanical vibrations discussed generally lead to impairments of the optical imaging quality, which are manifested for example as a loss of contrast and impair the yield of semiconductor products having entirely satisfactory quality. During the operation of actuator systems, it is practically unavoidable that heat is released. The heat can for example originate from electronic components of the actuator system such as amplifiers, for example, or else be produced by mechanical components of the actuator system as an undesirable secondary effect. The occurrence of heat in the system and in particular the occurrence of thermal gradients, can have a disadvantageous effect on the system; thus, in the case of a projection exposure apparatus, it can likewise result in an impairment of the optical imaging quality.

SUMMARY

The disclosure provides a projection exposure apparatus for semiconductor lithography which exhibits improved heat management.

In some embodiments, a projection exposure apparatus for semiconductor lithography includes at least one optical element and an actuator system for the mechanical actuation of the at least one optical element. The optical element includes an outer mount, and the actuator system includes a heat transport element for reducing a heat input into the at least one optical element, wherein the heat input is generated by heat arising during the operation of the actuator system in heated regions of the actuator system. The heated regions of the actuator system are arranged on the outer mount of an optical element. The heated regions are in thermal contact with the heat transport element, and the heat transport element is led toward the outside through the objective housing.

In certain embodiments, the projection exposure apparatus for semiconductor lithography has an actuator system for the mechanical actuation of at least one component of the projection exposure apparatus and also at least one mechanism, e.g., a heat transport element, for reducing the heat input on account of the heat arising during the operation of the actuator system into the at least one component. In other words, the mechanism serves to dissipate the waste heat of the actuator system from the surroundings of the actuated component or—as a variant—to have the effect that the heat that arises practically unavoidably during the operation of the actuator system is not released in the immediate surroundings of the component, but outside the surroundings of the component.

In both cases, the disclosure has the effect that the surroundings of the actuated component are subjected to reduced heating in comparison with certain prior art systems. Particularly in cases in which the component is an optical element arranged within or inside a projection objective, this measure is advantageous since the heating of an optical element or else of parts of a mount of an optical element generally leads to a change in the optical properties of the optical element and thus to imaging aberrations of the associated projection objective.

Conversely, the measure according to the disclosure has the effect that actuation can be effected with comparatively high capacities on account of the reduction of the heat input. What is thus achieved is that the tasks of the actuator system, for example movement to a specific position of a component or the rapid damping of undesirable vibrations, can be achieved at an increased speed by comparison with the prior art. In addition, the measure according to the disclosure permits higher forces to be applied by comparison with the prior art.

The undesired heating of the actuator system as discussed can be caused, for example, by the actuators themselves, for example by piezoelements, or else by electronic components, such as amplifiers for example, embodied in a manner integrated with the actuator system.

In this case, the mechanism can be suitable for transporting a fluid past heated regions of the actuator system. Thus, the mechanism can be embodied for example as lines or conduits through which the fluid flows, for example in a body which is in thermal contact with the component. The fluid can be, in particular, a liquid such as water or castor oil or else a gas, such as nitrogen or air by way of example. The fluid flowing past then absorbs the waste heat of the actuator system and dissipates it into a region where it can be released without disadvantageous consequences for the imaging quality of the superordinate system. Thus, by way of example, in the case of an application of the disclosure in a projection objective for semiconductor lithography, a liquid or gas flow can firstly be led past that region of the actuator system which is to be cooled, in order then to be led through the wall of the objective housing toward the outside, where it emits the waste heat to the cooling device of the objective housing—the so-called "lens cooler"—which is generally present anyway. The cooling capacity of the fluid cooling described above can be adapted for example by correspondingly adapting the quantity of fluid flowing past the heated region per unit time and/or the flow temperature of the fluid.

In this case, the disclosure is not restricted to the cooling fluid flowing past the expected region of the actuator system in lines; as an alternative or in addition, a directed gas flow which interacts with the heated regions of the actuator system can also be employed. Such a gas flow can also be adjusted as described in the previous paragraph for the modification of the cooling capacity.

The mechanism can likewise be a heat transport element which is in thermal contact with heated regions of the actuator system and has a high thermal conductivity, in particular a thermal conductivity of approximately 400 W/(m*K), or more. Such a heat transport element can for example be formed from copper or else as a heat pipe and be in direct mechanical and thus thermal contact with the heated region of the actuator system and hence dissipate the heat from the surroundings of the actuator system. By way of example, a Peltier element can be used as a heat sink on that side of the heat transport element which is remote from the actuator system. It is likewise possible—in a manner analogous to that described above—for that side of the heat transport element which is remote from the actuator system to be in thermal contact with the lens cooler described above. The heat transport element itself can also be embodied as a multicomponent body, that is to say that an element filled with a medium having a high thermal conductivity could be used. In particular water or sodium are appropriate here as media.

A minimization of the mechanical influence of the heat transport element on the actuator system can be achieved by virtue of the heat transport element being embodied as a thermally conductive strip, for example as a copper braided strip. As a result of the low stiffness of such a thermally conductive strip, mechanical disturbances of the actuator system and thus, if appropriate, of the actuated components are considerably reduced. In addition, it is also possible to use rigid thermally conductive elements which are provided with mechanical decouplings such as bellows, for example.

The actuated component will often be embodied as an optical element arranged in an inner mount in a projection objective. The inner mount itself is held, for its part, in an outer mount. In this case, the outer mount can be embodied as a ring-shaped body which, together with other outer mounts of similar configuration, forms the objective housing. The outer mounts described should be regarded as less important with regard to mechanical disturbances than the inner mounts, such that a mechanical contact with a heat transport element in this case gives rise to mechanical disturbances to a lesser extent. In those cases in which the heated region of an actuator system is thus arranged on an outer mount, this region can be cooled by direct mechanical contact with a heat transport element embodied in comparatively rigid fashion. In this case, as already discussed above, the heat transport element can be in thermal contact with the lens cooler on its side remote from the outer mount, for the purpose of heat dissipation.

One possible embodiment of the actuator system involves the latter being embodied as a damping system. Such damping systems are used to suppress mechanical excitations such as vibrations, for example, which could lead to a reduction of the imaging quality of a projection objective, for example, or to cause the vibrations to decay rapidly. In this case, the boundaries between an actuator system for positioning a component and an embodiment of the actuator system as a damping system are often fluid; in particular, it is possible to alter a positioning system with a sufficiently high regulating bandwidth as a damping system for damping undesirable vibrations. In one advantageous embodiment of the disclosure, the damping element can be realized via piezoelements, in particular as an actuator in the manner of the piezoactuator described in the published German patent application DE 102 25 266 A1, the piezoactuator being referred to as a piezocrawler. The document cited describes an actuator in which the actuator rotor or actuated runner (that is to say the moving part of the actuator, which generally acts on the component to be manipulated or to be positioned) is driven on via one or more advancing or feeder elements ("feet") which are realized as piezoelements and are perpendicular to the rotor. In this case, the advancing elements move perpendicular to their own longitudinal direction in the rotor direction. In this case, the actuator described can be operated in a mode in which the advancing elements remain on the actuator rotor instead of moving the rotor by setting down, advancing and drawing back. This variant opens up the possibility that an actuator which can also be used for manipulating the position of an optical element can be used as a vibration damper in an alternative or additional operating mode. The advantage particularly of the use of piezoelements in this case is that the latter have a comparatively high bandwidth, usually in the range of 0 to 2000 Hz.

As an alternative, the actuator system can also have a plunger-type coil. In this case, the plunger-type coil can be used in such a way that the output signal generated by it in the case of vibration of the system, having been inverted, phase-shifted and amplified, is fed to the plunger-type coil again. By way of example, an efficient damping functionality can be realized in this way. The use of the mechanism discussed above results in higher design freedom with regard to the electronic components which are used for amplifying, inverting and phase-shifting the output signal of the plunger-type coil. The same correspondingly holds true for alternative active actuator systems. In this case, a further advantage of the solution discussed is that the entire electronics for the operation of the actuator system can thus be integrated in direct proximity to the actuator system, with the result that the number and complexity of the interfaces with respect to a superordinate system such as, for example, a projection exposure apparatus for semiconductor lithography can be effectively limited; the use of an eddy current brake is also conceivable in a similar manner.

Particularly in those cases in which the optical component is arranged in a projection objective, the damping system can be embodied as a counter-vibrating mass with damper, the mass being arranged on the exterior of the objective housing. In the case of a mechanical excitation of the optical component, that is to say a vibration excitation, for example, the counter-vibrating mass is also excited, that is to say caused to vibrate, for example, on account of the mechanical coupling of the counter-vibrating mass via the objective housing. These vibrations can then be damped via the damper, the vibration of the optical components also being damped as a result. By virtue of the fact that the mechanical vibration energy dissipates as heat energy outside the objective housing in the case portrayed, those regions in the immediate surroundings of the optical component which are sensitive with regard to the imaging quality of the system, or the optical component itself can be effectively prevented from being heated. Moreover, this variant of the disclosure has the effect that less stringent demands are made of the structural space or package volume with regard to the constructional design of the damping system and, if appropriate, of a control/regulating system; in other words, the components used for damping are subjected to considerably less stringent restrictions with regard to their size and also their evolution of heat than would be the case if they were incorporated within the objective housing. In this case, too, the lens cooler can be used for dissipating the heat energy that arises.

As a further variant of the disclosure it is conceivable for the heated region of the actuator system to be in thermal contact with a body having a high specific heat capacity, e.g. a copper container filled with water or glycerol or a composite material composed of copper and plastic, in which the copper conducts the heat into the heat-storing plastic. In this case, in particular, the heated region of the actuator system can be at least partly enveloped by the body. This measure has the effect that, on account of the thermal contact between the body and the heated region of the actuator system, firstly the temperature increase of the overall system including the heated region and the body having a high specific heat capacity takes place more slowly than would be the case without the body. In addition, the peak temperature reached by the system is also reduced by comparison with the case without the body. In other words, the body acts as a thermal capacitor, which entails some advantages with regard to the control/regulation of the temperature adjustment. In particular, on account of the smaller temporal gradients of the temperature change, it is possible to use control/regulation with a smaller bandwidth than would be involved without the stated measure. In this case, the high specific heat capacity can be achieved by virtue of the body having a cavity filled with water. Moreover—in particular for applications in a vacuum such as e.g. in the case of a use of the actuator system according to the disclosure in an EUV projection exposure apparatus—the body can be embodied as a solid steel body in order to minimize the contamination of other system components that is caused by the body. In order to optimize the heat emission of the body in a vacuum by way of example, the coloration of the body can be chosen accordingly. In this case, in particular, those regions of the body which are remote from the component to be actuated can be provided with a surface structure, for example a coating or lacquering, which allows a maximum heat emission of the body by radiation.

In the extreme case, the use of the body makes it possible to dispense with an actively regulated temperature adjustment. By virtue of the fact that large temperature gradients are avoided as a result of the capacitor effect mentioned, it may suffice merely to compensate for the offset produced by the release of heat in the adjustment of the components via the actuators present.

A further embodiment of the disclosure consists in the fact that a control/regulating unit is present, which can drive the mechanism for reducing the heat input. In this case, the control/regulating unit can be connected to acceleration sensors and can be suitable for driving the mechanism for reducing the heat input on the basis of the parameters determined by the acceleration sensors. Such acceleration sensors can be fitted to an optical component, for example. In contrast to the measurement of a distance, the use of acceleration sensors has the advantage that imminent deflections of system components such as vibrations, for example, can be detected with a certain temporal lead, such that more time remains for a setting of the corresponding manipulated variables such as, for example, flow rate or temperature of a fluid. The reaction speed of the regulation is considerably improved as a result.

Furthermore, the control/regulating unit can be connected to a further control/regulating unit of the projection exposure apparatus or can be embodied as part of the latter and can be designed in such a way that the mechanism for reducing the heat input can be driven on the basis of imminent system events. Thus, by way of example, the control/regulating unit of the projection exposure apparatus, in the case of an imminent reset of the apparatus, can communicate a corresponding signal to the control/regulating unit which drives the mechanism. Usually, in the context of such a reset, practically all the actuator systems of the projection exposure apparatus are driven and carry out movements which in part cover the entire possible range of movement of the actuator systems. This has the effect that vibrations are induced into the system to an increased extent. In anticipation of such a measure, the temperature adjustment may then have already been correspondingly adapted beforehand, such that the effectiveness of the temperature-adjusting system is increased further. In this case, appropriate system events also include, besides the reset already discussed, events such as, for example, an imminent movement of a wafer stage or of a reticle stage.

An embodiment of the actuator system as a damping system including a passive and an active damping element has the advantage that a certain basic amount of the mechanical vibration energy is dissipated by the passive damping element. The vibration energy that still remains can then be damped in regulated or controlled fashion by the active damping element. The heat released by the electronics of the active damping element can be considerably reduced as a result.

BRIEF DESCRIPTION OF THE DRAWINGS

The disclosure is explained below with reference to the drawings, in which.

DETAILED DESCRIPTION

Figure 1:
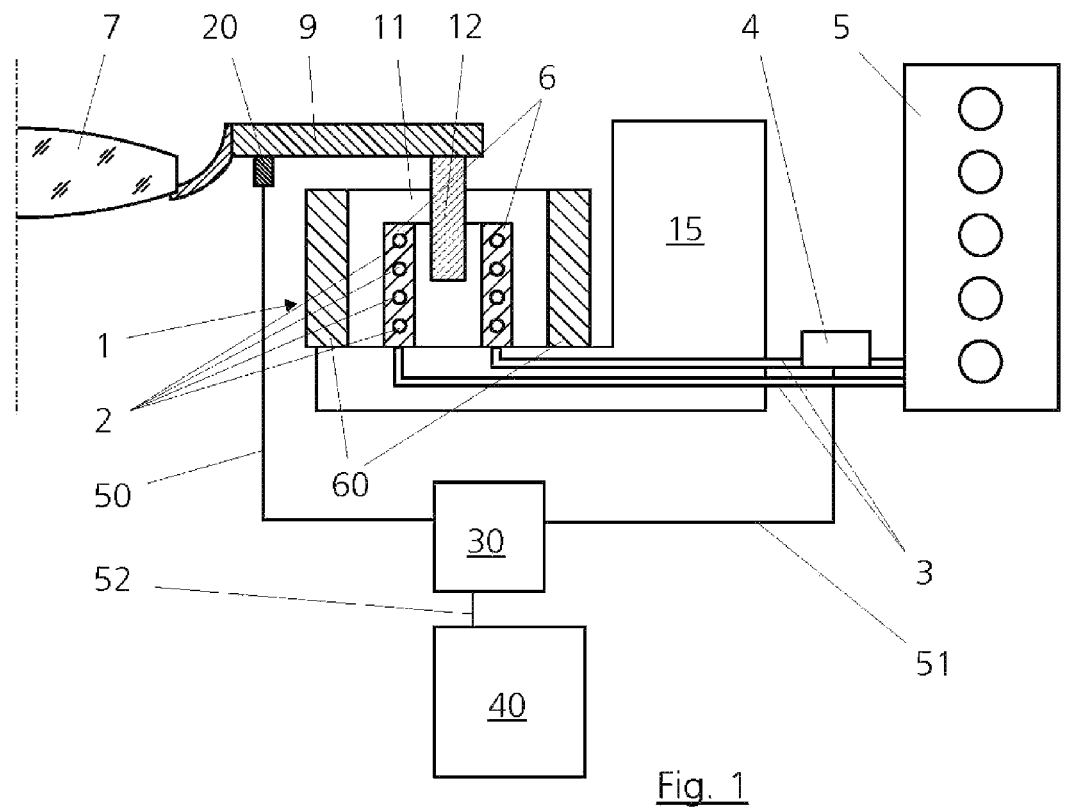
FIG. 1 shows a first embodiment of the disclosure.

FIG. 1 shows a first embodiment of the disclosure. In this case, the actuator system 1 shows the rotor or runner 12, on which the piezo-arrangement 11 acts. In this case, the piezo-arrangement 11 can be embodied as a combination of shear and stroke piezos, as described in the German patent application DE 102 25 266 A1. In this case, the rotor 12 is connected to the inner mount 9, in which the component embodied as optical element 7 in the present example is arranged. The piezo-arrangement 11 is provided with the cooling body 6, which, for its part, has the fluid channels 2. The structural unit including piezo-arrangement 11, cooling body 6 and fluid channels 2 is arranged, for its part, on the outer mount 15. The fluid lines 3 are led through the outer mount 15, the fluid used for cooling the actuator system 1 being conveyed through the fluid lines via the pump 4. The fluid can be for example water, castor oil, nitrogen or else air. It can be seen from FIG. 1 that the fluid is fed to the lens cooler 5, where it emits the heat absorbed from the actuator system 1. In this case, the lens cooler 5 is a temperature-adjusting unit which serves for cooling an objective housing externally. The objective housing, which is not illustrated in FIG. 1, is usually formed by outer mounts screwed onto one another in the manner of the outer mount 15 illustrated in FIG. 1. The pump 4 is connected via the signal line 51 to the control/regulating unit 30, which, for its part, is connected to the acceleration sensor 20 arranged on the inner mount 9 via the signal line 50. If, therefore, specific, increased acceleration values are determined by the acceleration sensor 20, the control/regulating unit can drive the pump 4 in such a way that the flow rate of the fluid through the cooling body 6 is increased and the cooling capacity is thus already increased in anticipation of the expected intensified heating of the actuator system 1. In an analogous manner—triggered by a corresponding signal of the control/regulating unit of the entire system 40—a corresponding driving of the pump 4 can be performed in advance of specific system events such as a reset, for example. For this purpose, the two control/regulating units 30 and 40 are connected via the signal line 52. It can readily be seen in FIG. 1 how the fluid flowing past the actuator system 1 absorbs the waste heat of the actuator system 1 and then dissipates it into a region where it can be released without disadvantageous consequences for the imaging quality of the superordinate system. In summary FIG. 1 schematically shows a sectional view of a projection exposure apparatus for semiconductor lithography (310) including an actuator system (1) which includes a piezocrawler or a piezo actuator, in general a piezo-arrangement 11, for the mechanical actuation of at least one component of the projection exposure apparatus. Further, the actuator system (1) has at least one mechanism (60, 6, 2, 4) for reducing the heat input on account of the heat arising during the operation of the actuator system (1) into the at least one component (7). FIG. 1 also shows schematically a projection exposure apparatus for semiconductor lithography (310) with an actuator system (1) for the mechanical actuation of at least one component of the projection exposure apparatus, wherein the actuator system (1) has at least one mechanism (60, 6, 2, 4) for reducing the heat input on account of the heat arising during the operation of the actuator system (1) into the at least one component (7). Further, a control/regulating unit (30) which is connected to at least one acceleration sensor (20) and is suitable for driving the mechanism (4) for reducing the heat input on the basis of the parameters determined by the acceleration sensor (20).

Furthermore, a body 60 is arranged in the region of the piezo-arrangement 11, the body having a high specific heat capacity and acting in the manner of a thermal capacitor. In this case, the body 60 can be realized as a water-filled element, for example. Furthermore—as an alternative to the illustration in FIG. 1—the body 60 can be in direct thermal contact with the cooling body 6 or itself be realized as cooling body.

Figure 2:
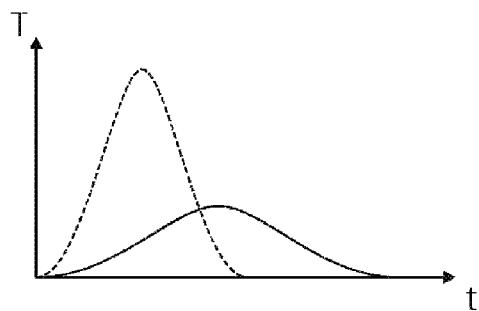
FIG. 2 shows a diagram in which the temperature at a point of the actuator system is plotted against time t.

The effect of the body 60 is illustrated with reference to FIG. 2. FIG. 2 shows a diagram in which the temperature T at a point of the actuator system 1 is plotted against time t. In this case, the dashed curve represents the case without the body 60, and the solid curve represents the case in which the body 60 is used. It can clearly be seen in FIG. 2 that the temperature profile is considerably flatter in the case of use of the body 60 than would be the case without use of the body 60. A flatter profile of the temperature over time is advantageous in terms of regulating technology, however, particularly because the risk of an overshoot of the regulation is thereby reduced.

Figure 3:
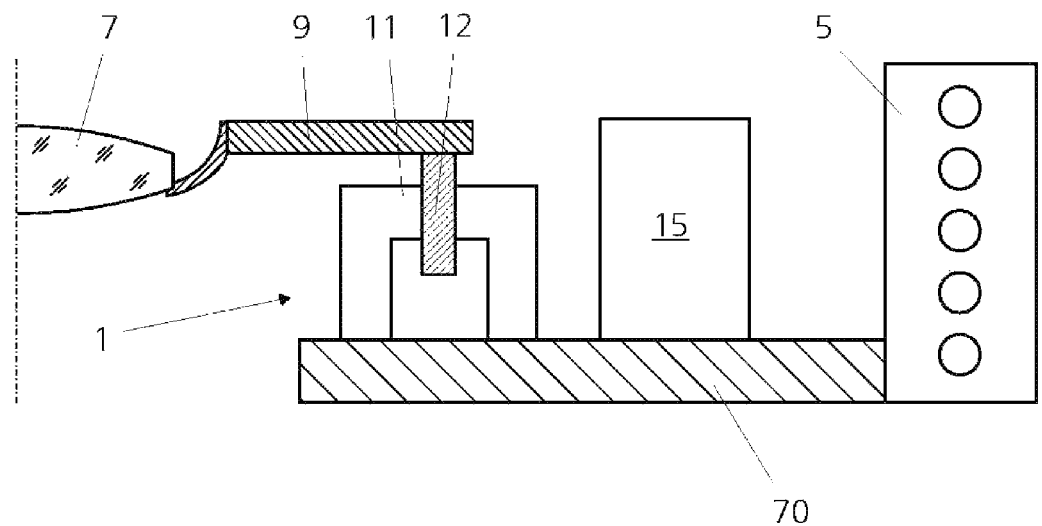
FIG. 3 shows a further variant of the disclosure, in which a heat transport element is employed instead of fluid cooling.

FIG. 3 illustrates a further variant of the disclosure, in which a heat transport element 70 is employed instead of fluid cooling. In this case, the heat transport element 70 is realized as a body composed of a material having a high thermal conductivity, which is in thermal contact with the actuator system 1 at its first end and is led through the outer mount 15 in the direction of the lens cooler 5. In this case, at its second end remote from the actuator system 1, the heat transport element 70 is in thermal contact with the lens cooler 5 and thus dissipates the heat generated in the actuator system 1 via the lens cooler 5. In order to improve the thermal conductivity of the heat transport element 70, the latter can also be embodied as a composite structure, for example as a metallic body with a sodium filling. Since, in the present example the thermal contact between the heat transport element 70 and the actuator system 1 is realized in such a way that the heat transport element 70 and the actuator system 1 with the heated regions are arranged on the outer mount, the probability of mechanical disturbances of the optical element 7 which might originate from the heat transport element 70 is reduced since the optical element 7 is mechanically substantially decoupled from the outer mount 15 via the inner mount 9. As described, FIG. 3 schematically shows a projection exposure apparatus for semiconductor lithography (310), including at least one optical element, an actuator system (1) for the mechanical actuation of the at least one optical element (7) which includes an outer mount (15). The actuator system (1) includes a heat transport element (70) for reducing a heat input into the at least one optical element (7), wherein the heat input is generated by heat arising during the operation of the actuator system (1) in heated regions of the actuator system (1), wherein the heated regions of the actuator system are arranged on the outer mount (15) of an optical element (7) and are in thermal contact with the heat transport element (70). In addition the heat transport element (70) is led toward the outside through the objective housing. In the following, further embodiments of the disclosure in accordance to FIG. 3 are described, including features from the embodiments as e.g. described in connection with FIGS. 1 and 5, but which are not necessarily shown in FIG. 3. In one of such embodiments the heat transport element (70) has a thermal conductivity of more or equal than 400 W/(m*K). In a further embodiment the heat transport element (70) is provided with a cooling body (5) at its side remote from the heated regions of the actuator system (1). Optionally the heat transport element (70) is embodied as a thermally conductive strip and/or a damping system. Further, the actuator system may include elements selected from the group consisting of piezocrawler, piezo actuators, plunger-type coils and eddy current brakes. In a further embodiment the optical element (7) is arranged in a projection objective, and the optional damping system may embodied as a counter-vibrating mass (80) with damper (100) (see FIG. 5). Such mass being arranged on the exterior of the objective housing. In Further embodiments the heated region of the actuator system (1) is in thermal contact with a body (60) (see FIG. 1) having a high specific heat capacity. As a further optional feature a control/regulating unit (30) is present, which can drive the heat transport element (70) for reducing the heat input (reference is also made to FIG. 1). In such embodiments the control/regulating unit (30) may be connected to at least one acceleration sensor (20) and may be suitable for driving the heat transport element (70) for reducing the heat input on the basis of the parameters determined by the acceleration sensor (20). In addition to one of the last two embodiments the control/regulating unit (30) may be connected to a further control/regulating unit (40) of the projection exposure apparatus or is embodied as part of the latter and may be designed in such a way that the heat transport element (70) for reducing the heat input can be driven on the basis of imminent system events. In further embodiments the actuator system (1) is embodied as a damping system and has a passive and also an active damping element. In general the described actuator system (1) is arranged in a projection objective (370) of the projection exposure apparatus (310).

Figure 4:
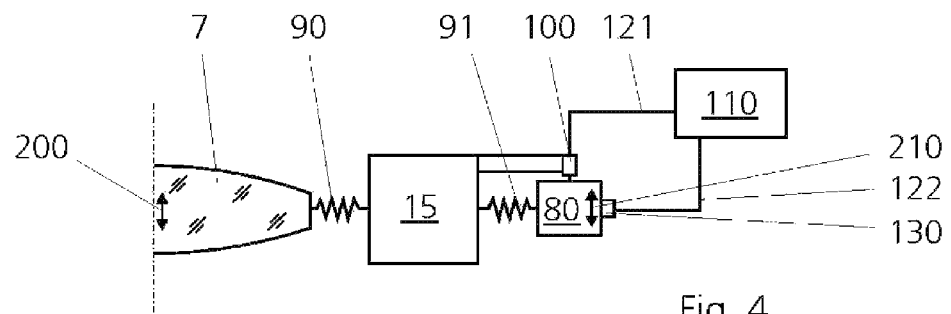
FIG. 4 shows an embodiment of the disclosure in which the vibration energy of an optical element is dissipated into heat energy outside rather than inside an objective housing.

FIG. 4 shows an embodiment of the disclosure in which the vibration energy of an optical element 7 is dissipated into heat energy outside rather than within an objective housing. The schematic illustration in FIG. 4 reveals that the optical element 7 is mechanically coupled to a counter-vibrating mass 80 via the outer mount 15. In this case, the mechanical coupling is symbolized by the springs 90 and 91 respectively indicated. In the case of a vibration of the optical element 7 in the direction of the double-headed arrow 200, a vibration in the direction of the double-headed arrow 210 is likewise induced into the counter-vibrating mass 80 via the mechanical coupling mentioned. The parameters of this vibration are picked up by the vibration sensor 130; the parameters can be, for example, speed, acceleration or else deflection. The vibration sensor 130 is connected to the regulating unit 110 via the signal line 122 in such a way that the detected parameters of the vibration sensor 130 are communicated to the regulating unit 110. On the basis of the parameters, the regulating unit 110 defines a control signal that is transmitted via the control line 121 to the actuator 100, which, for its part, acts mechanically on the counter-vibrating mass 80 and damps the vibration of the counter-vibrating mass 80. Consequently, the vibration of the optical element 7 is also effectively damped via the mechanical coupling already described above. One aspect of the solution illustrated in FIG. 4 consists in the fact that the heat which arises in connection with the damping of the vibration of the optical element 7 does not arise within the objective housing formed by a multiplicity of outer mounts, but rather is released outside such an objective housing. This results in improved possibilities for dissipating the heat without the latter possibly having disadvantageous effects on the imaging quality or other operating properties of a superordinate optical system. In summary, FIG. 4 schematically shows a section of a projection exposure apparatus for semiconductor lithography (310) including a projection objective with a projection objective housing and an optional actuator system (1) (as shown e.g. in FIG. 1 or 3) for the mechanical actuation of at least one optical component (7) arranged in the projection objective. The actuator system (1) optionally has at least one mechanism (60, 6, 2, 4) (as described in connection with FIGS. 1 and 3) for reducing the heat input on account of the heat arising during the operation of the actuator system (1) into the at least one optical component (7). Further, the optional actuator system (1) includes a damping system, the damping system including a counter-vibrating mass (80) with a damper (100) and the mass is arranged on the exterior of the objective housing.

Figure 5:
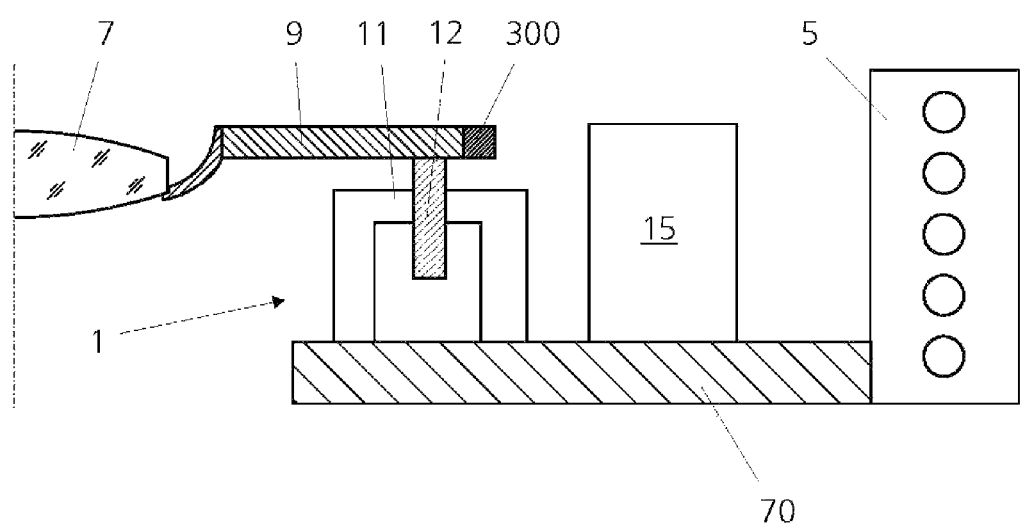
FIG. 5 shows a variant of the disclosure in which a passive vibration absorber is additionally employed as a passive damping element.

FIG. 5 shows a further variant of the disclosure, in which, in addition to the active actuator system 1 shown in FIG. 3, a passive vibration absorber 300 is employed as a passive damping element. In the example shown, the vibration absorber 300 is arranged on the inner mount 9 and contributes to the damping of vibrations of the inner mount 9. As a result, that portion of the damping which has to be damped by the active damping system in the manner of the actuator system 1 is reduced, such that overall a reduced control/regulating effort for the active damping is instigated and the heat released by the electronics of the active damping system is considerably reduced. In this case, the application of the passive vibration absorber is not restricted to the embodiment of the disclosure shown in FIG. 5; in principle, it can also be employed—in addition to the embodiment shown in FIG. 1—in further variants of the disclosure that are not illustrated in the drawings. From the above, FIG. 5 schematically shows a sectional view of a projection exposure apparatus for semiconductor lithography (310) including an actuator system (1) for the mechanical actuation of at least one component of the projection exposure apparatus. The actuator system (1) is embodied as a damping system including a passive and an active (as explained in FIG. 4) damping element, wherein the actuator system (1) has at least one mechanism 70 for reducing the heat input on account of the heat arising during the operation of the actuator system (1) into the at least one component (7). Alternative or in addition the mechanism for reducing the heat input may be embodied equal or similar as the ones described in connection with the embodiments of FIGS. 1 and 3 and being denoted with reference numerals 60, 6, 2 or 4.

Figure 6:
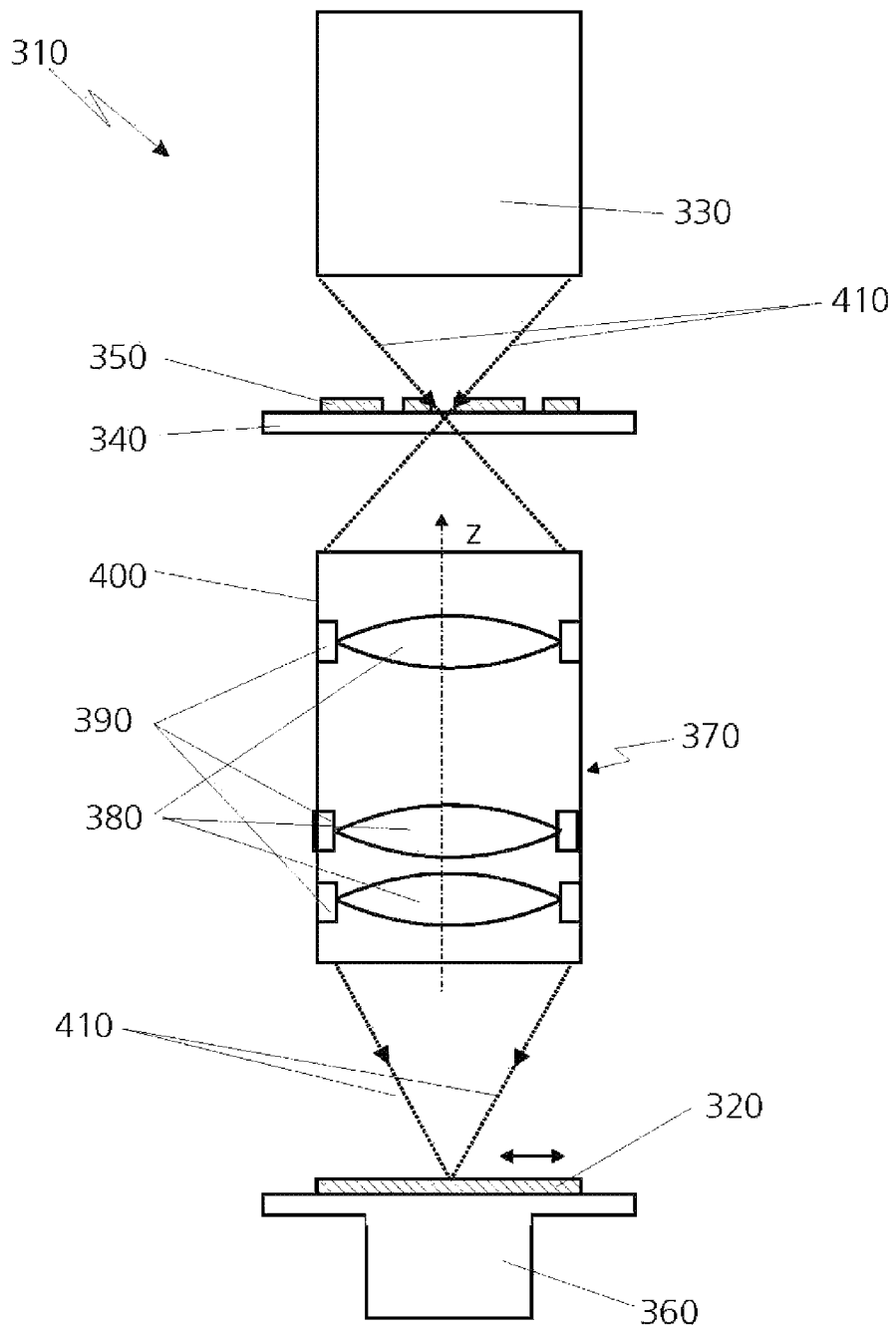
FIG. 6 shows a projection exposure apparatus for semiconductor lithography in which the actuator system according to the disclosure is employed.

FIG. 6 illustrates a projection exposure apparatus 310 for semiconductor lithography in which the actuator system according to the disclosure is employed. The apparatus serves for exposing structures onto a substrate coated with photosensitive materials, the substrate generally predominantly being composed of silicon and being referred to as a wafer 320, for the production of semiconductor components such as computer chips, for example.

In this case, the projection exposure apparatus 310 essentially includes an illumination system 330, a device 340 for receiving and exactly positioning a mask provided with a structure, a so-called reticle 350, which determines the subsequent structures on the wafer 320, a device 360 for retaining, moving and exactly positioning precisely the wafer 320, and an imaging device, namely a projection objective 370, including a plurality of optical elements 380 mounted in an objective housing 400 of the projection objective 370 via mounts 390.

In this case, the basic functional principle provides for the structures introduced into the reticle 350 to be imaged onto the wafer 320; the imaging is generally performed in demagnifying fashion.

After an exposure has taken place, the wafer 320 is moved further in the arrow direction, such that a multiplicity of individual fields, each having a structure predefined by the reticle 350, are exposed on the same wafer 320. On account of the step-by-step advancing movement of the wafer 320 in the projection exposure apparatus 310, the latter is often also referred to as a stepper.

The illumination system 330 provides a projection beam 410 for the imaging of the reticle 350 on the wafer 320, for example light or a similar electromagnetic radiation. A laser or the like can be used as a source of this radiation. The radiation is shaped in the illumination system 330 via optical elements in such a way that the projection beam 410 has the desired properties with regard to diameter, polarization, shape of the wavefront and the like upon impinging on the reticle 350.

Via the beams 410, an image of the reticle 350 is generated and transferred to the wafer 320 in correspondingly demagnified fashion by the projection objective 370, as has already been explained above. The projection objective 370 has a multiplicity of individual refractive, diffractive and/or reflective optical elements 380, such as e.g. lenses, mirrors, prisms, terminating plates and the like. In this case, one or more of the optical elements can be provided with an actuator system in the manner of the system illustrated in FIG. 1, 3 or 5.

Figure 7:
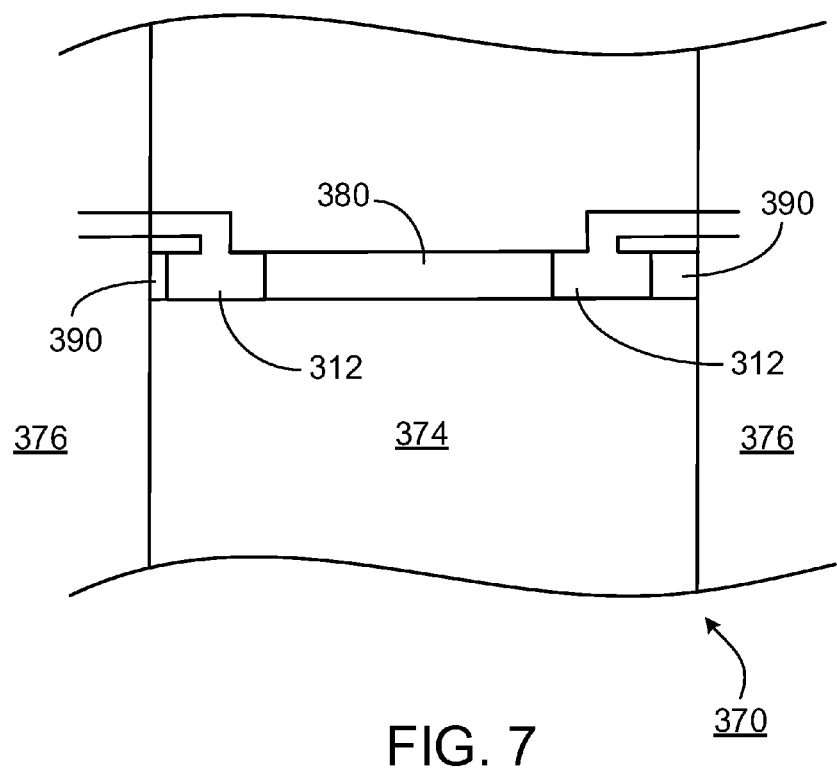
FIG. 7 shows a portion of a projection objective.

FIG. 7 shows a portion of projection objective 370 including a housing 372 and heat transport elements 312 extending from an interior 374 of housing 372 to an exterior 376 of housing 372.

The present disclosure may be embodied in other forms without departing from the spirit or essential attributes thereof, and accordingly, reference should be made to both the appended claims and to the foregoing specification as indicating the scope of the disclosure. The present disclosure includes also the aspects defined in the following clauses C to G, which form part of the present description but are not claims. The reference numerals in the clauses C to G refer to the reference numerals as explained in connection with the description of the above figures. The features of the embodiments described by the clauses represent embodiments of this disclosure. In addition also such embodiments in which features of the claims and/or the clauses are combined and/or replaced with or by ones of other claims or clauses are covered by the present disclosure.

C1 Projection exposure apparatus for semiconductor lithography (310) including an actuator system (1) which includes a piezocrawler or a piezo actuator, for the mechanical actuation of at least one component of the projection exposure apparatus, wherein the actuator system (1) has at least one mechanism (60, 6, 2, 4) for reducing the heat input on account of the heat arising during the operation of the actuator system (1) into the at least one component (7).

C2. Projection exposure apparatus (310) according to clause C1, characterized in that the mechanism (2, 6, 4) is suitable for transporting a fluid past heated regions of the actuator system (1).

C3. Projection exposure apparatus (310) according to clause C2, characterized in that the mechanism is embodied as lines (2) through which the fluid flows.

C4. Projection exposure apparatus (310) according to clause C3, characterized in that the fluid is a liquid such as water or castor oil or a gas such as nitrogen or air.

C5. Projection exposure apparatus (310) according to clause C2, characterized in that the fluid is embodied as a gas flow which interacts with the heated regions of the actuator system (1), in particular flows past the heated regions.

C6. Projection exposure apparatus (310) according to clause C1, characterized in that the mechanism is a heat transport element (70) which is in thermal contact with heated regions of the actuator system (1) and has a thermal conductivity of approximately 400 W/(m*K) or more.

C7. Projection exposure apparatus (310) according to clause C6, characterized in that the heat transport element (70) is provided with a cooling body (5) at its side remote from the heated regions of the actuator system (1).

C8. Projection exposure apparatus (310) according to either of clauses C6 and C7, characterized in that the heat transport element (70) is embodied as a thermally conductive strip.

C9. Projection exposure apparatus (310) according to any of clause C6 to C8, characterized in that the heated regions of the actuator system (1) are arranged on an outer mount (15) of an optical element (7) arranged in a projection objective and the heat transport element (70) is led toward the outside through the objective housing.

C10. Projection exposure apparatus (310) according to any of clauses C1 to C9, characterized in that the actuator system (1) is embodied as a damping system.

C11. Projection exposure apparatus (310) according to any of clauses C1 to C10, characterized in that the actuator system (1) includes a plunger-type coil or an eddy current brake.

C12. Projection exposure apparatus (310) according to clause C10, characterized in that the optical component (7) is arranged in a projection objective, and in that the damping system is embodied as a counter-vibrating mass (80) with damper (100), the mass being arranged on the exterior of the objective housing.

C13. Projection exposure apparatus (310) according to any of clauses C1 to C12, characterized in that the heated region of the actuator system (1) is in thermal contact with a body (60) having a high specific heat capacity.

C14. Projection exposure apparatus (310) according to any of clauses C1 to C13, characterized in that a control/regulating unit (30) is present, which can drive the mechanism (4) for reducing the heat input.

C15. Projection exposure apparatus (310) according to clause C14, characterized in that the control/regulating unit (30) is connected to at least one acceleration sensor (20) and is suitable for driving the mechanism (4) for reducing the heat input on the basis of the parameters determined by the acceleration sensor (20).

C16. Projection exposure apparatus (310) according to either of clauses C14 and C15, characterized in that the control/regulating unit (30) is connected to a further control/regulating unit (40) of the projection exposure apparatus or is embodied as part of the latter and is designed in such a way that the mechanism (4) for reducing the heat input can be driven on the basis of imminent system events.

C17. Projection exposure apparatus (310) according to any of the clauses C1 to C16, characterized in that the actuator system (1) is embodied as a damping system and has a passive and also an active damping element.

C18. Projection exposure apparatus (310) according to any of the clauses C1 to C17, characterized in that the actuator system (1) is arranged in a projection objective (370) of the projection exposure apparatus (310).

D1. Projection exposure apparatus for semiconductor lithography (310) including a projection objective with a projection objective housing, an actuator system (1) for the mechanical actuation of at least one optical component (7) arranged in the projection objective, wherein the actuator system (1) has at least one mechanism (60, 6, 2, 4) for reducing the heat input on account of the heat arising during the operation of the actuator system (1) into the at least one optical component (7) and wherein the actuator system includes a damping system, the damping system including a counter-vibrating mass (80) with a damper (100), the mass being arranged on the exterior of the objective housing.

D2. Projection exposure apparatus (310) according to clause D1, characterized in that the mechanism (2, 6, 4) is suitable for transporting a fluid past heated regions of the actuator system (1).

D3. Projection exposure apparatus (310) according to clause D2, characterized in that the mechanism is embodied as lines (2) through which the fluid flows.

D4. Projection exposure apparatus (310) according to clause D3, characterized in that the fluid is a liquid such as water or castor oil or a gas such as nitrogen or air.

D5. Projection exposure apparatus (310) according to clause D2, characterized in that the fluid is embodied as a gas flow which interacts with the heated regions of the actuator system (1), in particular flows past the heated regions.

D6. Projection exposure apparatus (310) according to clause D1, characterized in that the mechanism is a heat transport element (70) which is in thermal contact with heated regions of the actuator system (1) and has a thermal conductivity of approximately 400 W/(m*K) or more.

D7. Projection exposure apparatus (310) according to clause D6, characterized in that the heat transport element (70) is provided with a cooling body (5) at its side remote from the heated regions of the actuator system (1).

D8. Projection exposure apparatus (310) according to either of clauses D6 and D7, characterized in that the heat transport element (70) is embodied as a thermally conductive strip.

D9. Projection exposure apparatus (310) according to any of the clauses D6 to D8, characterized in that the heated regions of the actuator system (1) are arranged on an outer mount (15) of an optical element (7) arranged in a projection objective and the heat transport element (70) is led toward the outside through the objective housing.

D10. Projection exposure apparatus (310) according to any of clauses D1 to D9, characterized in that the actuator system includes elements selected from the group consisting of piezocrawler, piezo actuator, plunger-type coil and eddy current brake.

D11. Projection exposure apparatus (310) according to any of clauses D1 to D10, characterized in that the heated region of the actuator system (1) is in thermal contact with a body (60) having a high specific heat capacity.

D12. Projection exposure apparatus (310) according to any of clauses D1 to D11, characterized in that a control/regulating unit (30) is present, which can drive the mechanism (4) for reducing the heat input.

D13. Projection exposure apparatus (310) according to clause D12, characterized in that the control/regulating unit (30) is connected to at least one acceleration sensor (20) and is suitable for driving the mechanism (4) for reducing the heat input on the basis of the parameters determined by the acceleration sensor (20).

D14. Projection exposure apparatus (310) according to either of clauses D12 and D13, characterized in that the control/regulating unit (30) is connected to a further control/regulating unit (40) of the projection exposure apparatus or is embodied as part of the latter and is designed in such a way that the mechanism (4) for reducing the heat input can be driven on the basis of imminent system events.

D15. Projection exposure apparatus (310) according to any of clauses D1 to D14, characterized in that the actuator system (1) is embodied as a damping system and has a passive and also an active damping element.

D16. Projection exposure apparatus (310) according to any of clauses D1 to D15, characterized in that the actuator system (1) is arranged in a projection objective (370) of the projection exposure apparatus (310).

E1. Projection exposure apparatus for semiconductor lithography (310) including an actuator system (1) for the mechanical actuation of at least one component of the projection exposure apparatus, wherein the actuator system (1) has at least one mechanism (60, 6, 2, 4) for reducing the heat input on account of the heat arising during the operation of the actuator system (1) into the at least one component (7), a control/regulating unit (30) connected to at least one acceleration sensor (20) and is suitable for driving the mechanism (4) for reducing the heat input on the basis of the parameters determined by the acceleration sensor (20).

E2. Projection exposure apparatus (310) according to clause E1, characterized in that the mechanism (2, 6, 4) is suitable for transporting a fluid past heated regions of the actuator system (1).

E3. Projection exposure apparatus (310) according to clause E2, characterized in that the mechanism is embodied as lines (2) through which the fluid flows.

E4. Projection exposure apparatus (310) according to clause E3, characterized in that the fluid is a liquid such as water or castor oil or a gas such as nitrogen or air.

E5. Projection exposure apparatus (310) according to clause E2, characterized in that the fluid is embodied as a gas flow which interacts with the heated regions of the actuator system (1), in particular flows past the heated regions.

E6. Projection exposure apparatus (310) according to clause E1, characterized in that the mechanism is a heat transport element (70) which is in thermal contact with heated regions of the actuator system (1) and has a thermal conductivity of approximately 400 W/(m*K) or more.

E7. Projection exposure apparatus (310) according to clause E6, characterized in that the heat transport element (70) is provided with a cooling body (5) at its side remote from the heated regions of the actuator system (1).

E8. Projection exposure apparatus (310) according to either of clauses E6 and E7, characterized in that the heat transport element (70) is embodied as a thermally conductive strip.

E9. Projection exposure apparatus (310) according to any of clauses E6 to E8, characterized in that the heated regions of the actuator system (1) are arranged on an outer mount (15) of an optical element (7) arranged in a projection objective and the heat transport element (70) is led toward the outside through the objective housing.

E10. Projection exposure apparatus (310) according to any of clauses E1 to E9, characterized in that the actuator system (1) is embodied as a damping system.

E11. Projection exposure apparatus (310) according to any of clauses E1 to E10, characterized in that the actuator system has a piezocrawler.

E12. Projection exposure apparatus (310) according to any of clauses E1 to E10, characterized in that the actuator system (1) has a plunger-type coil.

E13. Projection exposure apparatus (310) according to any of clauses E1 to E10, characterized in that the actuator system (1) has an eddy current brake.

E14. Projection exposure apparatus (310) according to clause E10, characterized in that the optical component (7) is arranged in a projection objective, and in that the damping system is embodied as a counter-vibrating mass (80) with damper (100), the mass being arranged on the exterior of the objective housing.

E15. Projection exposure apparatus (310) according to any of clauses E1 to E14, characterized in that the heated region of the actuator system (1) is in thermal contact with a body (60) having a high specific heat capacity.

E16. Projection exposure apparatus (310) according to any of clauses E1 to E15, characterized in that the control/regulating unit (30) is connected to a further control/regulating unit (40) of the projection exposure apparatus or is embodied as part of the latter and is designed in such a way that the mechanism (4) for reducing the heat input can be driven on the basis of imminent system events.

E17. Projection exposure apparatus (310) according to any of clauses E1 to E16, characterized in that the actuator system (1) is embodied as a damping system and has a passive and also an active damping element.

E18. Projection exposure apparatus (310) according to any of clauses E1 to E17, characterized in that the actuator system (1) is arranged in a projection objective (370) of the projection exposure apparatus (310).

F1. Projection exposure apparatus for semiconductor lithography (310) including an actuator system (1) for the mechanical actuation of at least one component of the projection exposure apparatus, the actuator system (1) is embodied as a damping system including a passive and an active damping element, wherein the actuator system (1) has at least one mechanism (60, 6, 2, 4) for reducing the heat input on account of the heat arising during the operation of the actuator system (1) into the at least one component (7).

F2. Projection exposure apparatus (310) according to clause F1, characterized in that the mechanism (2, 6, 4) is suitable for transporting a fluid past heated regions of the actuator system (1).

F3. Projection exposure apparatus (310) according to clause F2, characterized in that the mechanism is embodied as lines (2) through which the fluid flows.

F4. Projection exposure apparatus (310) according to clause F3, characterized in that the fluid is a liquid such as water or castor oil or a gas such as nitrogen or air.

F5. Projection exposure apparatus (310) according to clause F2, characterized in that the fluid is embodied as a gas flow which interacts with the heated regions of the actuator system (1), in particular flows past the heated regions.

F6. Projection exposure apparatus (310) according to clause F1, characterized in that the mechanism is a heat transport element (70) which is in thermal contact with heated regions of the actuator system (1) and has a thermal conductivity of approximately 400 W/(m*K) or more.

F7. Projection exposure apparatus (310) according to clause F6, characterized in that the heat transport element (70) is provided with a cooling body (5) at its side remote from the heated regions of the actuator system (1).

F8. Projection exposure apparatus (310) according to either of clauses F6 and F7, characterized in that the heat transport element (70) is embodied as a thermally conductive strip.

F9. Projection exposure apparatus (310) according to any of clauses F6 to F8, characterized in that the heated regions of the actuator system (1) are arranged on an outer mount (15) of an optical element (7) arranged in a projection objective and the heat transport element (70) is led toward the outside through the objective housing.

F10. Projection exposure apparatus (310) according to any of clauses F1 to F9, characterized in that the actuator system (1) is embodied as a damping system.

F11. Projection exposure apparatus (310) according to any of clauses F1 to F10, characterized in that the actuator system has a piezocrawler.

F12. Projection exposure apparatus (310) according to any of clauses F1 to F10, characterized in that the actuator system (1) has a plunger-type coil.

F13. Projection exposure apparatus (310) according to any of clauses F1 to F10, characterized in that the actuator system (1) has an eddy current brake.

F14. Projection exposure apparatus (310) according to clause F10, characterized in that the optical component (7) is arranged in a projection objective, and in that the damping system is embodied as a counter-vibrating mass (80) with damper (100), the mass being arranged on the exterior of the objective housing.

F15. Projection exposure apparatus (310) according to any of clauses F1 to F14, characterized in that the heated region of the actuator system (1) is in thermal contact with a body (60) having a high specific heat capacity.

F16. Projection exposure apparatus (310) according to any of clause F1 to F15, characterized in that a control/regulating unit (30) is present, which can drive the mechanism (4) for reducing the heat input.

F17. Projection exposure apparatus (310) according to clause F16, characterized in that the control/regulating unit (30) is connected to at least one acceleration sensor (20) and is suitable for driving the mechanism (4) for reducing the heat input on the basis of the parameters determined by the acceleration sensor (20).

F18. Projection exposure apparatus (310) according to either of clauses F16 and F17, characterized in that the control/regulating unit (30) is connected to a further control/regulating unit (40) of the projection exposure apparatus or is embodied as part of the latter and is designed in such a way that the mechanism (4) for reducing the heat input can be driven on the basis of imminent system events.

F19. Projection exposure apparatus (310) according to any of clauses F1 to F18, characterized in that the actuator system (1) is arranged in a projection objective (370) of the projection exposure apparatus (310).

G1. Projection exposure apparatus for semiconductor lithography (310) including an actuator system (1) for the mechanical actuation of at least one component of the projection exposure apparatus, characterized in that the actuator system (1) has at least one mechanism (60, 6, 2, 4) for reducing the heat input on account of the heat arising during the operation of the actuator system (1) into the at least one component (7).

G2. Projection exposure apparatus (310) according to clause G1, characterized in that the mechanism (2, 6, 4) is suitable for transporting a fluid past heated regions of the actuator system (1).

G3. Projection exposure apparatus (310) according to clause G2, characterized in that the mechanism is embodied as lines (2) through which the fluid flows.

G4. Projection exposure apparatus (310) according to clause G3, characterized in that the fluid is a liquid such as water or castor oil or a gas such as nitrogen or air.

G5. Projection exposure apparatus (310) according to clause G2, characterized in that the fluid is embodied as a gas flow which interacts with the heated regions of the actuator system (1), in particular flows past the heated regions.

G6. Projection exposure apparatus (310) according to clause G1, characterized in that the mechanism is a heat transport element (70) which is in thermal contact with heated regions of the actuator system (1) and has a thermal conductivity of approximately 400 W/(m*K) or more.

G7. Projection exposure apparatus (310) according to clause G6, characterized in that the heat transport element (70) is provided with a cooling body (5) at its side remote from the heated regions of the actuator system (1).

G8. Projection exposure apparatus (310) according to either of clauses G6 and G7, characterized in that the heat transport element (70) is embodied as a thermally conductive strip.

G9. Projection exposure apparatus (310) according to any of clauses G6 to G8, characterized in that the heated regions of the actuator system (1) are arranged on an outer mount (15) of an optical element (7) arranged in a projection objective and the heat transport element (70) is led toward the outside through the objective housing.

G10. Projection exposure apparatus (310) according to any of clauses G1 to G9, characterized in that the actuator system (1) is embodied as a damping system.

G11. Projection exposure apparatus (310) according to any of clauses G1 to G10, characterized in that the actuator system has a piezocrawler.

G12. Projection exposure apparatus (310) according to any of clauses G1 to G10, characterized in that the actuator system (1) has a plunger-type coil.

G13. Projection exposure apparatus (310) according to any of clauses G1 to G10, characterized in that the actuator system (1) has an eddy current brake.

G14. Projection exposure apparatus (310) according to clause G10, characterized in that the optical component (7) is arranged in a projection objective, and in that the damping system is embodied as a counter-vibrating mass (80) with damper (100), the mass being arranged on the exterior of the objective housing.

G15. Projection exposure apparatus (310) according to any of clauses G1 to G14, characterized in that the heated region of the actuator system (1) is in thermal contact with a body (60) having a high specific heat capacity.

G16. Projection exposure apparatus (310) according to any of clauses G1 to G15, characterized in that a control/regulating unit (30) is present, which can drive the mechanism (4) for reducing the heat input.

G17. Projection exposure apparatus (310) according to clause G16, characterized in that the control/regulating unit (30) is connected to at least one acceleration sensor (20) and is suitable for driving the mechanism (4) for reducing the heat input on the basis of the parameters determined by the acceleration sensor (20).

G18. Projection exposure apparatus (310) according to either of clauses G16 and G17, characterized in that the control/regulating unit (30) is connected to a further control/regulating unit (40) of the projection exposure apparatus or is embodied as part of the latter and is designed in such a way that the mechanism (4) for reducing the heat input can be driven on the basis of imminent system events.

G19. Projection exposure apparatus (310) according to any of clauses G1 to G18, characterized in that the actuator system (1) is embodied as a damping system and has a passive and also an active damping element.

G20. Projection exposure apparatus (310) according to any of clauses G1 to G19, characterized in that the actuator system (1) is arranged in a projection objective (370) of the projection exposure apparatus (310).

The invention claimed is:

1. A projection exposure apparatus, comprising:
   a housing having an interior and an exterior;
   an optical element;
   a mount for the optical element;
   an actuator system to mechanically actuate the optical element, the actuator system comprising a heat transport element in thermal contact with regions of the mount that are exposed to heat generated during use of the actuator to reduce heat input into the optical element from the actuator system during use of the actuator system,
   wherein the heat transport element extends to the exterior of the housing, and the projection exposure apparatus is a semiconductor microlithography projection exposure apparatus.

2. The projection exposure apparatus according to claim 1, wherein the heat transport element has a thermal conductivity of at least 400 W/(m*K).

3. The projection exposure apparatus according to claim 1, wherein the heat transport element comprises a cooling body remote from the regions of the mount.

4. The projection exposure apparatus according to claim 1, wherein the heat transport element comprises a thermally conductive strip.

5. The projection exposure apparatus according to claim 1, wherein the actuator system comprises a damping system.

6. The projection exposure apparatus according to claim 1, wherein the actuator system comprises at least one element selected from the group consisting of a piezocrawler, a piezo actuator, a plunger-type coil and an eddy current brake.

7. The projection exposure apparatus according to claim 5, wherein the damping system comprises a counter-vibrating mass with a damper, and the mass is on the exterior of the housing.

8. The projection exposure apparatus according to claim 1, further comprising a body having a high specific heat capacity, wherein the body is thermal contact with at least one of the regions of the mount.

9. The projection exposure apparatus according to claim 1, further comprising a first control/regulating unit to drive the heat transport element to reducing heat input into the optical element.

10. The projection exposure apparatus according to claim 9, further comprising an acceleration sensor connected to the first control/regulating unit so that the heat transport element reduces heat input into the optical element based on parameters determined by the acceleration sensor.

11. The projection exposure apparatus according to claim 9, further comprising a second control/regulating unit connected to the first control/regulating unit so that the heat transport element is driven to reduce heat input into the optical element based on imminent system events.

12. The projection exposure apparatus according to claim 9, further comprising a second control/regulating unit, wherein the first control/regulating unit is a portion of the second control/regulating unit so that the heat transport element is driven to reduce heat input into the optical element based on imminent system events.

13. The projection exposure apparatus according to claim 1, wherein the actuator system comprises a damping system comprising a passive damping element and an active damping element.

14. The projection exposure apparatus according to claim 1, wherein the projection exposure apparatus comprises a projection objective having the housing.

15. The projection exposure apparatus according to claim 14, wherein the actuator system is arranged in the projection objective.

16. The projection exposure apparatus according to claim 14, further comprising an illumination system.

17. A projection objective, comprising:
   a housing having an interior and an exterior;
   an optical element;
   a mount for the optical element;
   an actuator system to mechanically actuate the optical element, the actuator system comprising a heat transport element in thermal contact with regions of the mount that are exposed to heat generated during use of the actuator to reduce heat input into the optical element from the actuator system during use of the actuator system,
   wherein the heat transport element extends to the exterior of the housing, and the projection exposure objective is a semiconductor microlithography projection objective.

18. The projection exposure objective according to claim 17, wherein the heat transport element has a thermal conductivity of at least 400 W/(m*K).

19. The projection exposure objective according to claim 17, wherein the heat transport element comprises a cooling body remote from the regions of the mount.

20. The projection exposure objective according to claim 17, wherein the heat transport element comprises a thermally conductive strip.

21. The projection exposure objective according to claim 16, wherein the actuator system comprises a damping system.

22. The projection exposure apparatus of claim 1, A projection exposure apparatus, comprising:
   a housing having an interior and an exterior;
   an optical element
   a mount for the optical element
   an actuator system to mechanically actuate the optical element, the actuator system comprising a heat transport element in thermal contact with regions of the mount that are exposed to heat generated during use of the actuator to reduce heat input into the optical element from the actuator system during use of the actuator system,
   wherein the heat transport element extends to the exterior of the housing, and the projection exposure apparatus is a semiconductor microlithography projection exposure apparatus, and wherein the heat transport element comprises a body having conduits therein, the conduits being configured to have a fluid flow therethrough to reduce heat input into the optical element from the actuator system during use of the actuator system.

23. The projection exposure apparatus of claim 22, wherein the conduits are configured to be disposed in fluid communication with a lens cooler disposed in the exterior of the housing.

24. A projection objective, comprising:
a housing having an interior and an exterior;
an optical element a mount for the optical element
an actuator system to mechanically actuate the optical element, the actuator system comprising a heat transport element in thermal contact with regions of the mount that are exposed to heat generated during use of the actuator to reduce heat input into the optical element from the actuator system during use of the actuator system,
wherein the heat transport element extends to the exterior of the housing, and the projection exposure objective is a semiconductor microlithography projection objective, and
wherein the heat transport element comprises a body having conduits therein, the conduits being configured to have a fluid flow therethrough to reduce heat input into the optical element from the actuator system during use of the actuator system.

25. The projection objective of claim 24, wherein the conduits are configured to be disposed in fluid communication with a lens cooler disposed in the exterior of the housing.

* * * * *

UNITED STATES PATENT AND TRADEMARK OFFICE
CERTIFICATE OF CORRECTION

| | | |
|---|---|---|
| PATENT NO. | : 9,030,644 B2 | Page 1 of 1 |
| APPLICATION NO. | : 13/196239 | |
| DATED | : May 12, 2015 | |
| INVENTOR(S) | : Benjamin Sigel et al. | |

It is certified that error appears in the above-identified patent and that said Letters Patent is hereby corrected as shown below:

In the claims

Col. 18, line 52, Claim 22, delete "The projection exposure apparatus of claim 1,".

Col. 18, line 55, Claim 22, delete "element" and insert -- element; --.

Col. 18, line 56, Claim 22, delete "element" and insert -- element; --.

Col. 19, line 12, Claim 24, delete "an optical element a mount for the optical element" and insert -- an optical element;

a mount for the optical element; --.

Signed and Sealed this
Sixth Day of October, 2015

Michelle K. Lee
*Director of the United States Patent and Trademark Office*